United States Patent
Kim et al.

(10) Patent No.: US 8,054,302 B2
(45) Date of Patent: Nov. 8, 2011

(54) DIGITAL TO ANALOG CONVERTER WITH MINIMUM AREA AND SOURCE DRIVER HAVING THE SAME

(75) Inventors: Beop-Hee Kim, Yongin-si (KR);
Ji-Woon Jung, Gwangmyeong-si (KR);
Yong-Weon Jeon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1148 days.

(21) Appl. No.: 11/778,158

(22) Filed: Jul. 16, 2007

(65) Prior Publication Data

US 2008/0030489 A1    Feb. 7, 2008

(30) Foreign Application Priority Data

Aug. 2, 2006 (KR) .................. 10-2006-0073067

(51) Int. Cl.
*G09G 3/18* (2006.01)

(52) U.S. Cl. .......... 345/204; 345/205; 345/89; 341/126; 341/144

(58) Field of Classification Search .................. 345/204, 345/205, 89, 98, 99, 100, 690; 341/126, 341/144, 150
See application file for complete search history.

(56) References Cited

U.S. PATENT DOCUMENTS

| 5,977,898 A | 11/1999 | Ling et al. |
| 2002/0121995 A1* | 9/2002 | Tabler ............... 341/145 |
| 2006/0023001 A1* | 2/2006 | Sung et al. ............ 345/690 |
| 2006/0255994 A1* | 11/2006 | Lin ................. 341/144 |

FOREIGN PATENT DOCUMENTS

| JP | 05268093 A | 10/1993 |
| JP | 06120832 | 4/1994 |
| JP | 06152420 A | 5/1994 |
| JP | 2004080238 | 3/2004 |
| JP | 2005033483 | 2/2005 |
| JP | 2005217855 | 8/2005 |
| JP | 2005277943 | 10/2005 |
| JP | 2005286615 | 10/2005 |
| KR | 100286326 B1 | 1/2001 |

* cited by examiner

*Primary Examiner* — Amare Mengistu
*Assistant Examiner* — Joseph G Rodriguez
(74) *Attorney, Agent, or Firm* — Volentine & Whitt, PLLC

(57) ABSTRACT

Embodiments of the invention provide a digital-to-analog converter (DAC) that is configured to process upper data bits, a control data bit, and a lower data bit using two decoders and a control logic. The resulting DAC provides high resolution output using a minimum circuit area. Embodiments of the invention also provide a sample and hold circuit for a DAC that reduces the effects of parasitic capacitance at the input of an operational amplifier (OP-AMP).

20 Claims, 9 Drawing Sheets

Fig. 4

| Data[3:0] | Output of First Decodr — Before Sample Mode | Output of Second Decodr — Before Sample Mode | Output of DAC 100 — Sample Mode | Output of DAC 100 — First Hold Mode | Output of DAC 100 — Second Hold Mode |
|---|---|---|---|---|---|
| 0000 | 0V | 0V | 0V | 0V | 0V |
| 0001 | 0V | 1V | 0V | 0V | 1V |
| 0010 | 4V | 0V | 2V | 4V | 2V |
| 0011 | 4V | 1V | 2V | 4V | 3V |
| 0100 | 4V | 0V | 0V | 4V | 4V |
| 0101 | 4V | 1V | 2V | 4V | 5V |
| 0110 | 8V | 0V | 2V | 8V | 6V |
| 0111 | 8V | 1V | 0V | 8V | 7V |
| 1000 | 8V | 0V | 0V | 8V | 8V |
| 1001 | 8V | 1V | 2V | 8V | 9V |
| 1010 | 12V | 0V | 2V | 12V | 10V |
| 1011 | 12V | 1V | 0V | 12V | 11V |
| 1100 | 12V | 0V | 0V | 12V | 12V |
| 1101 | 12V | 1V | 2V | 12V | 13V |
| 1110 | 16V | 0V | 2V | 16V | 14V |
| 1111 | 16V | 1V | 2V | 16V | 15V |

Fig. 8

| Data[3:0] | Output of First Decodr | Output of Second Decodr | Output of DAC 100' | | |
|---|---|---|---|---|---|
| | Before Sample Mode | Before Sample Mode | Sample Mode | First Hold Mode | Second Hold Mode |
| 0000 | 0V | 0V | 0V | 0V | 0V |
| 0001 | 0V | 1V | 0V | 0V | 1V |
| 0010 | 4V | 0V | 4V | 4V | 2V |
| 0011 | 4V | 1V | 4V | 4V | 3V |
| 0100 | 4V | 0V | 4V | 4V | 4V |
| 0101 | 4V | 1V | 4V | 4V | 5V |
| 0110 | 8V | 0V | 8V | 8V | 6V |
| 0111 | 8V | 1V | 8V | 8V | 7V |
| 1000 | 8V | 0V | 8V | 8V | 8V |
| 1001 | 8V | 1V | 8V | 8V | 9V |
| 1010 | 12V | 0V | 12V | 12V | 10V |
| 1011 | 12V | 1V | 12V | 12V | 11V |
| 1100 | 12V | 0V | 12V | 12V | 12V |
| 1101 | 12V | 1V | 12V | 12V | 13V |
| 1110 | 16V | 0V | 16V | 16V | 14V |
| 1111 | 16V | 1V | 16V | 16V | 15V |

DIGITAL TO ANALOG CONVERTER WITH MINIMUM AREA AND SOURCE DRIVER HAVING THE SAME

CROSS-REFERENCE TO RELATED APPLICATIONS

This U.S. non-provisional patent application claims priority under 35 U.S.C. §119 of Korean Patent Application No. 10-2006-0073067, filed on Aug. 2, 2006, the entire contents of which are hereby incorporated by reference.

BACKGROUND OF THE INVENTION

The present invention disclosed herein relates to a digital-to-analog converter (DAC), and more particularly, to a DAC with a reduced circuit area.

A digital value is expressed numerically using binary logic, where each bit has one of two possible logic values, i.e., 0 and 1. A digital value can be one of several predetermined values within a range. On the contrary, an analog value may be any value within a continuous range. Physical variations such as temperature, pressure, intensity of light, voice signal, position, circulation speed, flow rate, etc. are perceived by humans and conventional sensors as analog values.

All analog signals inputted to a digital system should be converted into digital format in advance. Likewise, an output of the digital system is in digital format, but such output can be converted into analog format as needed.

Generally, digital-to-analog (D/A) conversion is a procedure of receiving a digital value represented by a digital code and then converting it into a predetermined voltage or current in proportion to the digital value. During D/A conversion, a reference voltage Vref is used in determining maximum output or maximum value that a D/A converter (DAC) produces. 16 binary numbers can be expressed using 4-bits to represent output voltages of the DAC. An actual analog output voltage Vout is proportional to an input binary number, and is expressed as a multiple of the binary number. Strictly, when the reference voltage Vref is a constant, the output voltage Vout has only a discrete value, e.g., one of 16 possible voltage levels, so that the output of the DAC is not an analog value. However, the number of possible output values can be increased by increasing the number of bits of input data. A larger number of possible output values in the output range reduces the difference between DAC output values.

When the DAC input includes a relatively large number of bits, the DAC provides a relatively high-resolution output. A circuit area of the DAC is increased proportionally with resolution. That is, as the number of bits of the digital signal increases by 1 bit, an area of a decoder in the DAC increases by twice. Thus, since a chip size of the DAC increases.

For example, provided that the input data is 8 bit in a conventional R-type (resistive string) DAC, the DAC is configured with $2^8$ resistors, $2^8$ metals and one 256×1 decoder. Herein, the metals denote signal lines that transmit input signals decoded by the decoder when the DAC is realized in a wafer or a chip. In case of fabricating a 10-bit DAC, 1,024 resistors, 1,024 metals and one 1024×1 decoder are needed. Therefore, in comparison of a decoder of the 10-bit DAC with that of the 8-bit DAC, the decoder of 10-bit DAC is four times greater in size than the decoder of 8-bit DAC, and the decoder of 10-bit DAC has four times the number of resistors and metals of the 8-bit DAC.

Other problems also exist with conventional DAC's. For example, conventional DAC's typically implement a sample and hold circuit using an operational amplifier (OP-AMP). Unfortunately, parasitic capacitance at an input terminal of the OP-AMP has an undesirable effect on an output of the DAC when modulating a voltage level of a non-inverting input terminal of the OP-AMP.

SUMMARY OF THE INVENTION

Embodiments of the invention provide a digital-to-analog converter (DAC) that is configured to process upper data bits, a control data bit, and a lower data bit using two decoders and a control logic. The resulting DAC provides high resolution output using a minimum circuit area. Embodiments of the invention also provide a sample and hold circuit for a DAC that reduces the effects of parasitic capacitance at the input of an operational amplifier (OP-AMP).

Embodiments of the invention provide a DAC (digital to analog converter) configured to convert digital data to an analog voltage, the digital data having upper bit data, a control bit data, and a lower bit data. The DAC includes: a control logic configured to receive the upper bit data and the control bit data; a first resistor circuit configured to divide first and second reference voltages to output a plurality of first division voltages; a first decoder coupled to the control logic and the first resistor circuit, the first decoder configured to output a selected one of the plurality of first division voltages based on an output of the control logic; a second resistor circuit configured to divide third and fourth reference voltages to output a plurality of second division voltages; a second decoder coupled to the lower bit data and the second resistor circuit, the second decoder configured to output a selected one of the plurality of second division voltages in response to the lower bit data; a selection circuit coupled to the control bit data and the second resistor circuit, the selection circuit configured to output a selected one of the third and fourth reference voltages according to the control bit data; and a sample and hold circuit coupled to the first and second decoders, the sample and hold circuit configured to output the analog voltage in response to an output voltage of the first decoder, an output voltage of the second decoder and an output voltage of the selection circuit.

Embodiments of the invention provide a Liquid Crystal Display (LCD) system that includes: a LCD panel; and a source driver coupled to the LCD panel, the source driver including at least one DAC, the at least one DAC configured to divide 4-bit input data into two upper bit data, a control bit data, and a lower bit data. The DAC may include a 4×1 decoder, a 2×1 decoder, control logic, and a sample and hold circuit.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 4 is a comparison table illustrating outputs of first and second decoders before a sample mode, and outputs of the DAC in the sample mode, a first hold mode, and a second hold mode, respectively, when 4-bit digital data are inputted into the DAC of FIG. 1;

FIG. 8 is a comparison table illustrating outputs of first and second decoders before a sample mode, and outputs of the DAC in the sample mode, a first hold mode, and a second hold mode, respectively, when 4-bit digital data are inputted into the DAC of FIG. 5.

DESCRIPTION OF EMBODIMENTS

In an embodiment of the present invention, a digital-to-analog converter (DAC) block receives a digital signal and converts it to an analog signal. The analog signal is outputted to a display apparatus. A detailed constitution of the inventive DAC and a method thereof will be described below.

Figure 1:
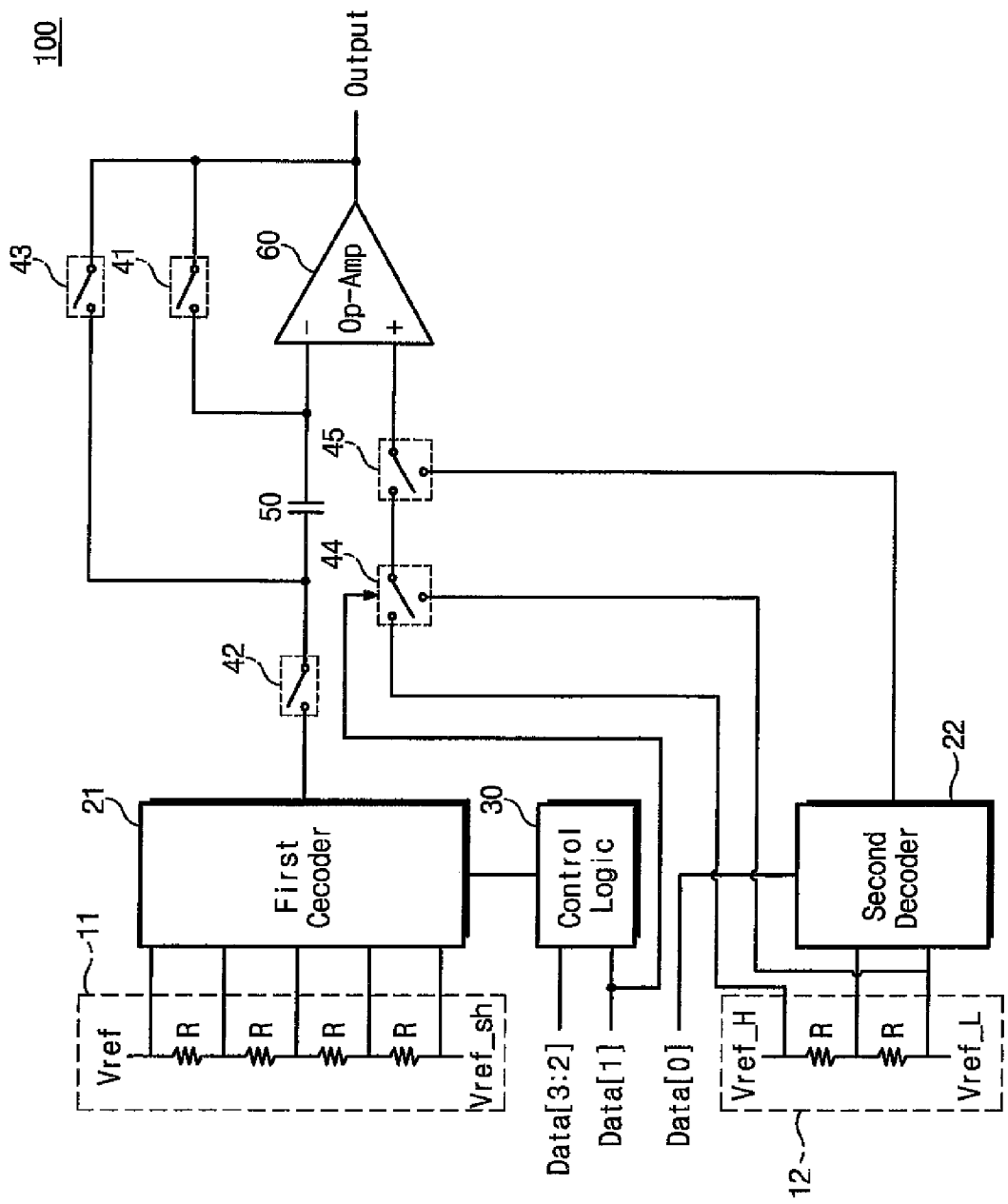
FIG. 1 is a block diagram illustrating a digital to analog converter (DAC) according to an embodiment of the present invention.

FIG. 1 is a block diagram illustrating a DAC according to an embodiment of the present invention. The DAC of FIG. 1 has a modified structure of an R-type (resistive string) DAC. Referring to FIG. 1, a first reference voltage (hereinafter, referred to as "Vref") denotes a reference voltage that determines an analog output voltage. A second reference voltage (hereinafter, referred to as "Vref_sh") and a fourth reference voltage (hereinafter, referred to as "Vref_L") denote ground voltages which are arbitrarily set. It is not necessary to set the Vref_sh and the Vref_L to the same voltage. That is, each of the Vref_sh and the Vref_L may be set to VSS and other voltages.

A third reference voltage (hereinafter, referred to as "Vref_H") denotes a voltage level fractionated depending on number of bits of digital data. For instance, when dividing n-bit digital data into upper bit of n/2 bit, control bit, and lower bit of (n/2)−1 bit, and decoding them, a first decoder 21 outputs a voltage level equal to the difference between the Vref and the Vref_sh divided by 2n/2. A second decoder 22 outputs a voltage level equal to the voltage level of the first decoder 21 divided by 2(n/2)−1. For example, for 4-bit data, when Vref, Vref_sh, and Vref_L are 16V, 0V, and 0V, respectively, the voltage level output from the first decoder 21 is 4V, and Vref_H is set to 2V.

Resistor circuits 11 and 12 output a plurality of voltages by dividing the Vref and Vref_H voltages in proportion to the resistance. Each of the resistors R may have substantially equal resistance values. The first resistor circuit 11 outputs voltages by equally dividing a voltage difference between the Vref and the Vref_sh in proportion to the resistance. For example, when the Vref is 16V and the Vref_sh is 0V, the first resistor circuit 11 outputs 0V, 4V, 8V, 12V and 16V, respectively. Each of the first resistor circuit 11 outputs represents a step in possible outputs from the first decoder 21. The second resistor circuit 12 outputs a plurality of voltages by dividing a voltage difference between the Vref_H and the Vref_L in proportion to the resistance. For example, when the Vref, the Vref_sh, and the Vref_L are 16V, 0V, 0V, respectively, the second resistor circuit 12 outputs 0V, 1V and 2V, respectively.

A control logic 30 receives digital data regulates an output voltage level of the first decoder 21 according to the state of the control bit output from the control logic 30. For example, if the control bit is 1, the first decoder 21 outputs a voltage with an increased voltage level (e.g., an increase of one step). Otherwise, the first decoder 21 outputs the voltage with an original voltage level. The original voltage level is based on data coded in the upper data bits. For example, where upper Data [3:2] is "10", the original coded voltage is 8V. If the control bit Data [1] is "1", then the first decoder 21 is configured to output 12V (a one step increase). A single control logic 30 may control multiple DACs.

Switches 41-45 initialize an output of the operational amplifier (OP-AMP) 60 or determine a sample mode and a hold mode. The first switch 41 initializes the output of the OP-AMP 60. The second switch 42 determines the sample mode in a sample and hold circuit. The third switch 43 forms a feedback loop during the hold mode in the sample and hold circuit. The fourth switch 44 is connected to the Vref_H provided that the control bit of the digital data is 1, but connected to the Vref_L otherwise. That is, the fourth switch 44 is a selection circuit for selecting one of the Vref_H and the Vref_L depending on the control bit data. The fifth switch 45 connects the fourth switch 44 to a non-inverting input terminal (+terminal) of the OP-AMP 60 during the sample mode and the first hold mode, and connects the second decoder 22 to the non-inverting input terminal of the OP-AMP 60 during the second hold mode.

The sample and hold circuit is configured with a capacitor 50, the OP-AMP 60, and the switches 41, 42, 43 and 45. The sample and hold circuit is used for receiving signals from sources which are different from one another. That is, the sample and hold circuit can combine data inputted from a source during the sample mode and data inputted from another source during the hold mode.

In the present invention, an operation mode of the sample and hold circuit is divided into the sample mode, the first hold mode, and the second hold mode. In the sample and hold circuit, the second hold mode is used for reducing an output voltage of the first hold mode by a desired voltage level. Therefore, the sample and hold circuit samples the output voltage of the first decoder 21 during the sample mode, and receives the reference voltage from the selection circuit 44 during the first hold mode. In addition, the sample and hold circuit increases/decreases the reference voltage inputted during the first hold mode by the output voltage of the second decoder 22 during the second hold mode, increases/decreases the sampled voltage by the increased/decreased voltage, and outputs a finally-increased/decreased voltage as the analog voltage.

Referring further to FIG. 1, the DAC 100 converts 4-bit digital data (Data [3:0]) to an analog voltage output from the Op-Amp 60. In order to minimize an area of the DAC 100, the decoder is divided into two decoders, e.g., first and second decoders 21 and 22. That is, the digital data are divided into two upper bits (Data [3:2]), the control bit (Data [1]) and the lower bit (Data [0]). The two upper bits (Data [3:2]) and the control bit (Data [1]) of the digital data are inputted into the first decoder 21. The lower bit (Data [0]) of the digital data is inputted into the second decoder 22.

In the conventional art, 16 resistors and one 16×1 decoder are required for decoding the 4-bit digital data. Alternatively, 8 resistors and two 4×1 decoders are required for decoding the 4-bit digital data if using the two decoders. According to the embodiment of the invention illustrated in FIG. 1, when the 4-bit digital data are divided into two upper bits (Data [3:2]), a control bit (Data [1]) and a lower bit (Data [0]), the DAC may be configured with 6 resistors (in resistor circuits 11 and 12), one 4×1 decoder (first decoder 21), one 2×1 decoder (second decoder 22), and a control logic 30 for controlling the control bit.

Figure 2:
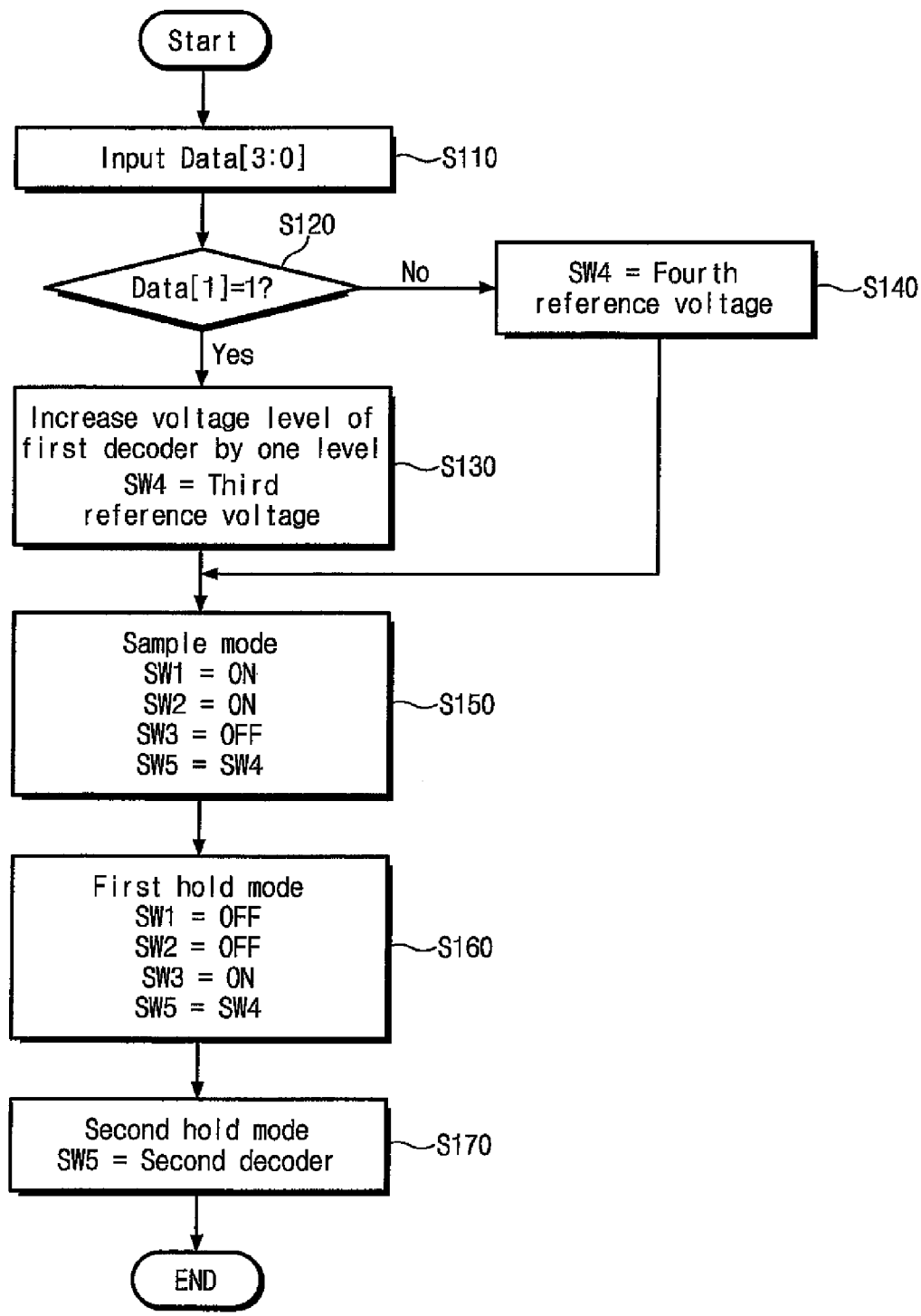
FIG. 2 is a flowchart illustrating an operation of the DAC of FIG. 1.

FIG. 2 is a flowchart illustrating an operation of the DAC of FIG. 1. In operation S110, the 4-bit digital data (Data [3:0]) are inputted into the second decoder 22 and the control logic 30. In operation S120, it is determined whether Data [1] is 1 or not. If the Data [1] is 1, the process proceeds to operation S130. Otherwise, the process proceeds to operation S140.

In operation S130, the level of the output voltage of the first decoder 21 is increased by one level, and the fourth switch 44 is connected to the third reference voltage Vref_H. For example, when the Vref, the Vref_sh, and the Vref_L are 16V, 0V, and 0V, respectively, the Vref_H is 2V. Herein, though an original voltage level of the first decoder 21 is 4V in case of the 4-bit digital data (Data [3:2]="01"), the first decoder 21 outputs 8V if the Data [1]="1". That is, the voltage level of the Data [1] digit becomes 2V assuming that the Vref, Vref_sh and Vref_L are 16V, 0V and 0V, respectively when the 4-bit digital data (Data [3:0]) are converted into analog signals. Thus, in the operation S130, the voltage level of the output voltage of the first decoder 21 is increased by 4V in case that the Data [1] is 1, and is decreased by 2V during the second hold mode.

In operation S140, the voltage level of the output voltage of the first decoder 21 is maintained in its entirety, and the fourth switch 44 is connected to the fourth reference voltage Vref_L.

Operation S150 is the sample mode in the sample and hold circuit. During the sample mode, the output voltage of the first decoder 21 is inputted into the inverting input terminal (−terminal) of the OP-AMP 60 through the capacitor 50. When the control bit of the digital data is 1, the fourth switch 44 is connected to the third reference voltage Vref_H. When the control bit of the digital data is 0, the fourth switch 44 is connected to the fourth reference voltage Vref_L. The fifth switch 45 is connected to the fourth switch 44 during the sample mode. For example, when the 4-bit digital data is "1010", and the Vref and the Vref_L are 16V and 0V, respectively, an upper 2-bit (Data [3:2], a control bit (Data [1]) and a lower bit (Data [0]) are "10, "1" and "0", respectively. The first decoder 21 outputs 8V originally after receiving the upper 2-bit, but then outputs 12V (the next higher step voltage) since the control bit is "1". The output of the first decoder 21 is inputted into the inverting input terminal of the OP-AMP 60 through the capacitor via the second switch 42. Here, the fourth switch 44 is connected to the Vref_H, and the fifth switch 45 is connected to the output coupled to the fourth switch 44. That is, the Vref_H is inputted to the non-inverting input terminal of the OP-AMP 60. Since a voltage difference between a voltage of the non-inverting input terminal and a voltage of the inverting input terminal is 0V in case that the OP-AMP 60 is an ideal OP-AMP, the output of the DAC 100 becomes 0V. In operation S150, the first switch 41 is turned on, the second switch 42 is turned on, the third switch 43 is turned off, and the fifth switch 45 is connected to the fourth switch (selector 44). That is, the output of the first decoder 21 is connected to the inverting input terminal of the OP-AMP 60, and the fourth switch (selector) 44 is connected to the non-inverting input terminal of the OP-AMP 60. The DAC 100 outputs Vref_L when Data [1] is 0, but outputs Vref_H when Data [1] is 1.

The hold mode is divided into a first hold mode and a second hold mode depending on connection state of the fifth switch 45. The first hold mode corresponds to a mode when the fifth switch 45 is connected to the fourth switch 44, and the second hold mode corresponds to a mode when the fifth switch 45 is connected to the second decoder 22.

Operation S160 is the first hold mode in the sample and hold circuit. During the first hold mode, the output voltage stored at the capacitor 50, i.e., the output voltage of the first decoder 21, is outputted in its entirety. In operation S160, the first switch 41 is turned off, the second switch 42 is turned off, the third switch 43 is turned on, and the fifth switch 45 is connected to the fourth switch (selector) 44. The output of the DAC 100 is equal to the output of the first decoder 21.

Operation S170 is the second hold mode in the sample and hold circuit. During the second hold mode, the output voltage of the first hold mode is reduced by a voltage at the fifth switch 45, i.e., a voltage difference between the voltage output from the fourth switch (selector) 44 and a voltage output from the second decoder 22. In operation S170, the fifth switch 45 is connected to the second decoder 22. The DAC 100 outputs a voltage of the first hold mode decreased by a voltage dropped at the instant that the fifth switch 45 is connected to the second decoder 22.

Figure 3:
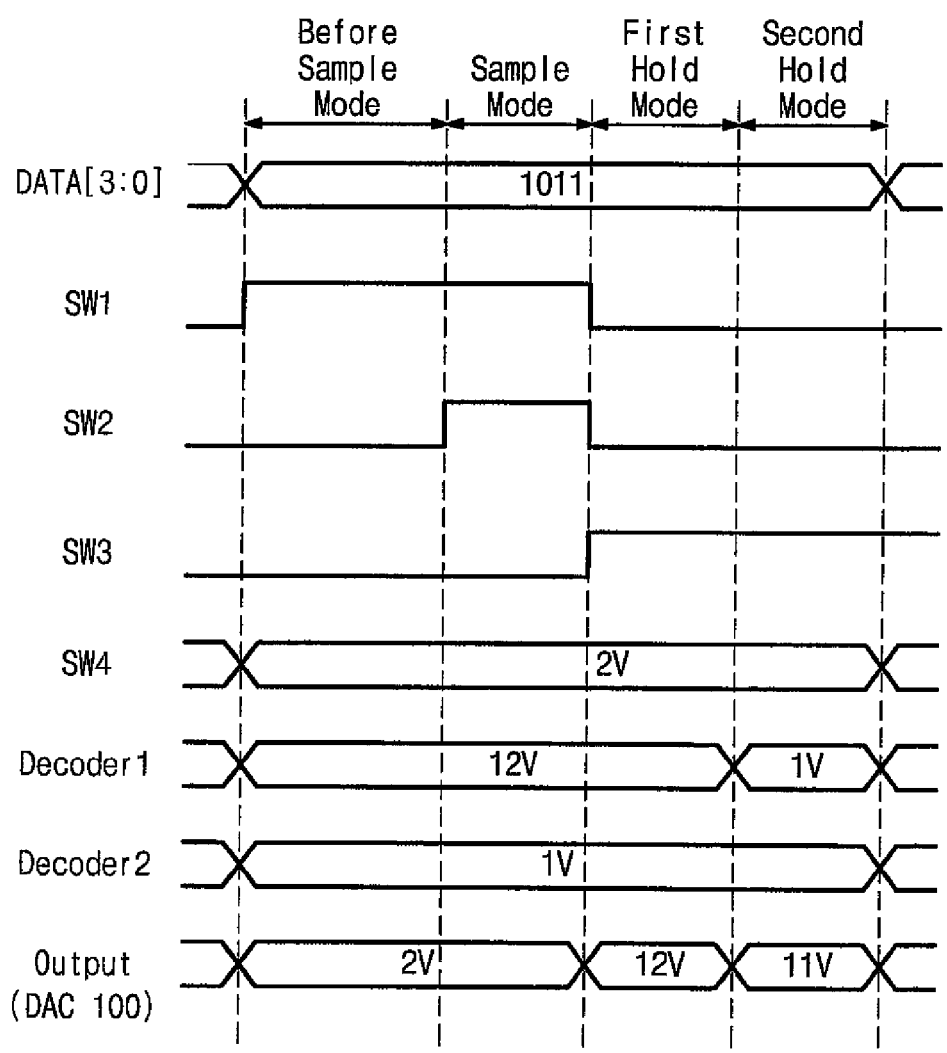
FIG. 3 is a timing diagram illustrating the operation of the DAC of FIG. 1.

FIG. 3 is a timing diagram illustrating the operation of the DAC of FIG. 1. FIG. 3 illustrates specific operations of switches of the DAC, outputs of the first and second decoders, and a final output. Referring to FIGS. 1 and 3, when a digital signal "1011" is inputted, the output of the first decoder 21 is 12V, and the output of the second decoder 22 is 1V. The output of the DAC 100 is 2V in the sample mode. The output of the DAC 100 is 12V in the first hold mode. The final output, i.e., the output of the DAC 100 in the second hold mode is 11 V.

FIG. 4 is a comparison table illustrating outputs of first and second decoders 21 and 22 before the sample mode, and outputs of the DAC 100 in the sample mode, the first hold mode, and the second hold mode, respectively, when 4-bit digital data are inputted into the DAC 100 of FIG. 1. Referring to FIGS. 1 and 4, before the sample mode, an output voltage of the first decoder 21 has a voltage level which is one level higher than the original output voltage level when the Data [1] is '1'. The first decoder 21 outputs a voltage with the original voltage level when the Data [1] is '0'. The second decoder 22 outputs 0V or 1V depending on the Data [0] before the sample mode.

In the sample mode, the DAC outputs 2V when the Data [1] is '1', whereas it outputs 0V when the Data [1] is '0'. In case that the fifth switch 45 is connected to the fourth switch 44 (i.e., in the first hold mode), the output of the DAC is equal to the output of the first decoder 21. In case that the fifth switch 45 is connected to the second decider 22 (i.e., in the second hold mode), the DAC outputs a voltage that the output voltage of the DAC of the first hold mode is decreased by the drop voltage due to the fifth switch 45 (i.e., a voltage difference between the output voltage connected to the fourth switch 44 and the voltage of the second decoder 22).

Figure 5:
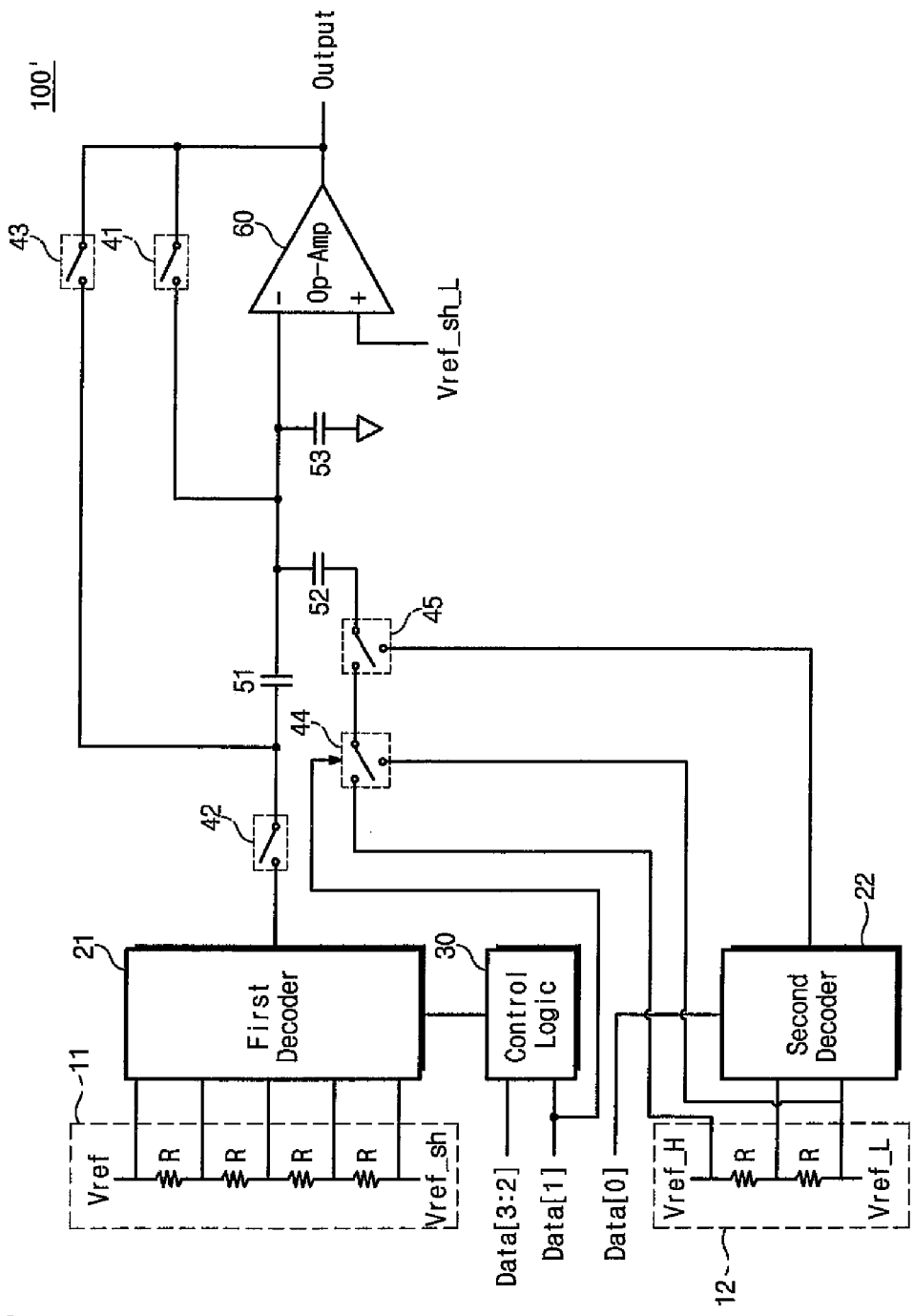
FIG. 5 is a block diagram illustrating a DAC according to another embodiment of the present invention.

When the sample and hold circuit is embodied using the OP-AMP, an error may occur in the output of the DAC due to a parasitic capacitance at an input terminal of the OP-AMP. Therefore, there is required a DAC that cannot be affected by the parasitic capacitance. FIG. 5 illustrates a DAC according to another embodiment that can prevent the effect of the parasitic capacitance in the sample and hold circuit using the OP-AMP.

FIG. 5 is a block diagram illustrating a DAC according to another embodiment of the present invention. Since the DAC 100' of FIG. 5 includes some common features with the DAC 100 of FIG. 1, duplicate description will be omitted herein. Referring to FIG. 5, the input terminal of the OP-AMP 60 contains a parasitic capacitor 53. In the present embodiment, the non-inverting input terminal of the OP-AMP 60 is connected to a fifth reference voltage Vref_sh_L for preventing the effect of the parasitic capacitor 53. The fifth reference voltage Vref_sh_L may alternatively be tied to the second reference voltage Vref_sh or the fourth reference voltage Vref_L, according to design choice.

The fifth switch 45 is connected to a second capacitor 52. The second capacitor 52 is connected to a first capacitor 51. An operation of the DAC 100' before the sample mode is the same as the operation of the DAC of FIG. 1.

Figure 6:
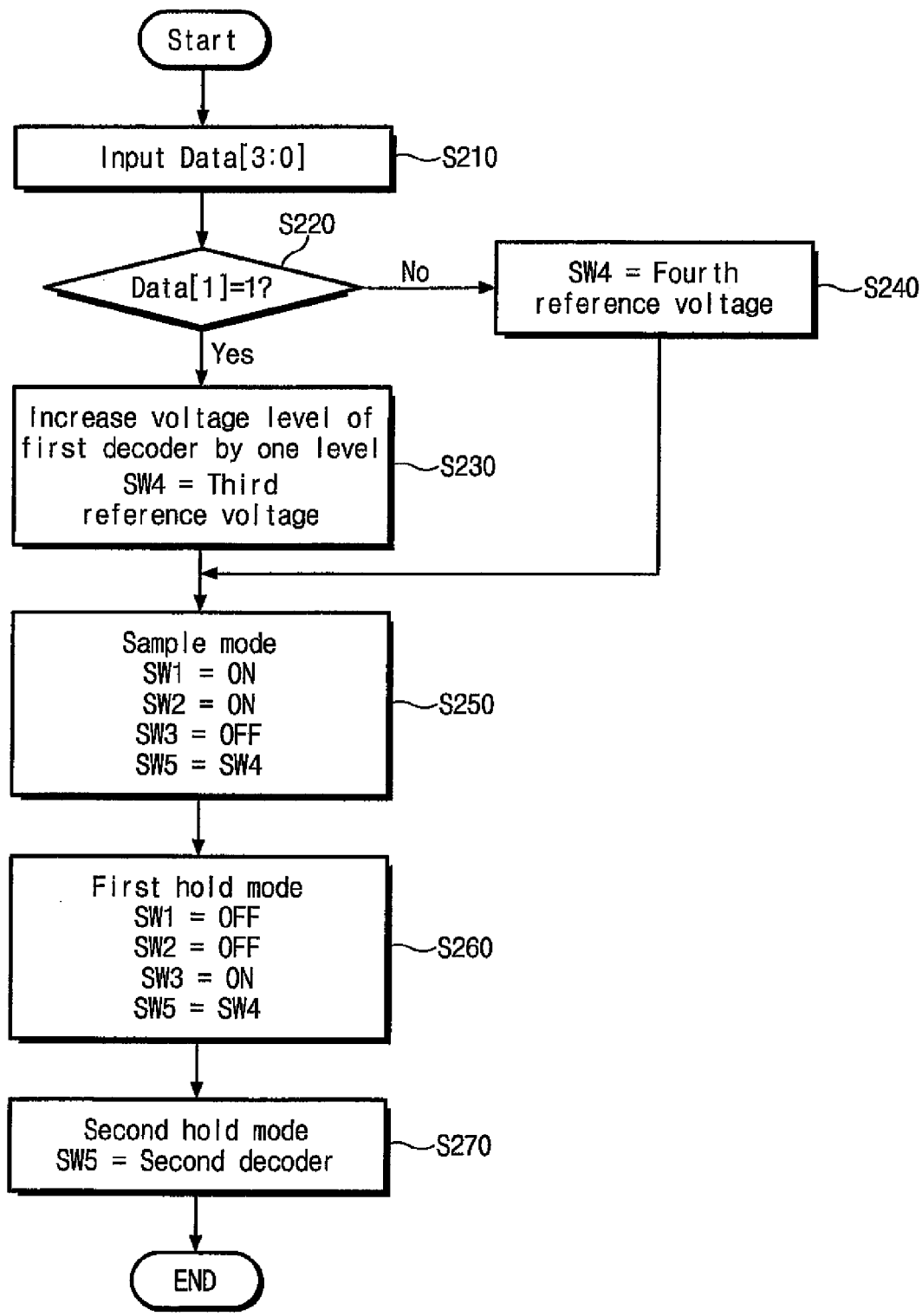
FIG. 6 is a flowchart illustrating an operation of the DAC of FIG. 5.

FIG. 6 is a flowchart illustrating an operation of the DAC of FIG. 5. Operations S210 through S240 correspond to operations before the sample mode, and they are equivalent to operations S110 through S140 of FIG. 2. Accordingly, duplicate descriptions will be omitted.

Operation S250 is the sample mode in the sample and hold circuit. During the sample mode, an output voltage of the first decoder 21 is inputted into an inverting input terminal (−terminal) of the OP-AMP 60 through the first capacitor 51. An output of the DAC 100' is the same as the output of the first decoder 21. In operation S250, a first switch 41 is turned on, a second switch 42 is turned on, a third switch 43 is turned off, and the fifth switch 45 is connected to a fourth switch 44. That is, the output of the first decoder 21 is connected to the inverting input terminal of the OP-AMP 60, and the fourth switch 44 is connected to the second capacitor 52. The DAC 100' outputs the same voltage as the output voltage of the first decoder 21 through the first capacitor 51 and the first switch 41.

Operation S260 is a first hold mode in the sample and hold circuit. During the first hold mode, an output voltage stored in the first capacitor 51, i.e., the output voltage of the first decoder 21, is outputted in its entirety. In the second hold mode, the DAC 100' outputs a voltage through the voltage of the first capacitor 51 and the second capacitor 52 connected to the fifth switch 45. In operation S260, the first switch 41 is turned off, the second switch 42 is turned off, the third switch 43 is turned on, and the fifth switch 45 is connected to the output of the fourth switch 44. The output of the DAC 100' is the same as the output of the first decoder 21.

Operation S270 is a second hold mode in the sample and hold circuit. In the second hold mode, the DAC 100' outputs a voltage corresponding to the voltage of the first capacitor 51 and the voltage of the second capacitor 52 connected to the fifth switch 45. In the second hold mode, the DAC 100' outputs a voltage of the DAC' in the first hold mode decreased by a drop voltage due to the fifth switch 45 (i.e., a voltage difference between the output voltage of the resistor connected to the fourth switch 44 and the voltage of the second decoder 22).

Figure 7:
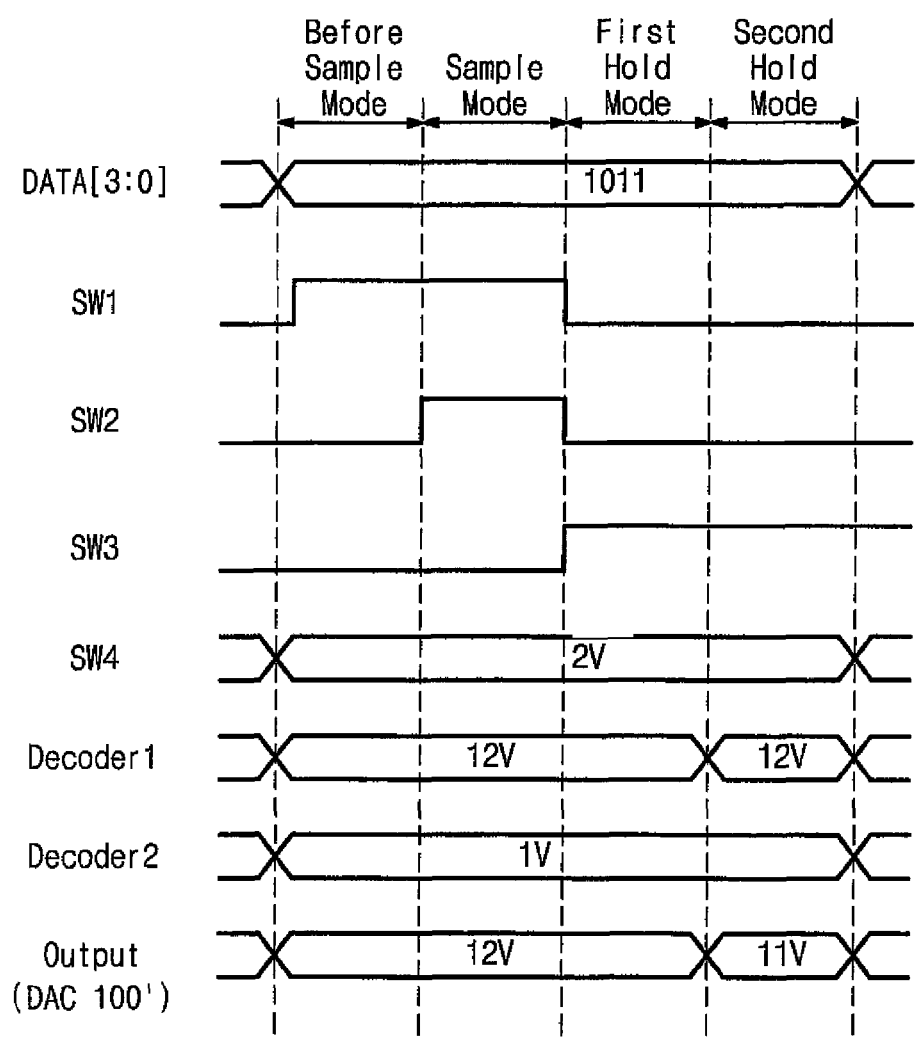
FIG. 7 is a timing diagram illustrating the operation of the DAC of FIG. 5.

FIG. 7 is a timing diagram illustrating the operation of the DAC of FIG. 5. FIG. 7 illustrates specific operations of switches of the DAC 100', outputs of the first and second decoders 21 and 22, and a final output of the DAC 100'. Referring to FIGS. 5 through 7, the output of the first decoder 21 is 12V and the output of the second decoder 22 is 1V when a digital signal "1011" is inputted. The output of the DAC 100' is 12V in the sample mode and 12V in the first hold mode. The final output, i.e., the output of the DAC 100' in the second hold mode, is 11 V.

FIG. 8 is a comparison table illustrating outputs of first and second decoders before the sample mode, and outputs of the DAC 100' in the sample mode, the first hold mode, and the second hold mode, respectively, when 4-bit digital data are inputted into the DAC 100' of FIG. 5. Referring to FIGS. 5 and 8, the outputs of the first and second decoders 21 and 22 are the same as the table of FIG. 4 before the sample mode. During the sample mode, the output of the DAC 100' is equal to the output of the first decoder 21. The outputs of the DAC 100' in the first and second hold modes are the same as the table of FIG. 4.

Figure 9:
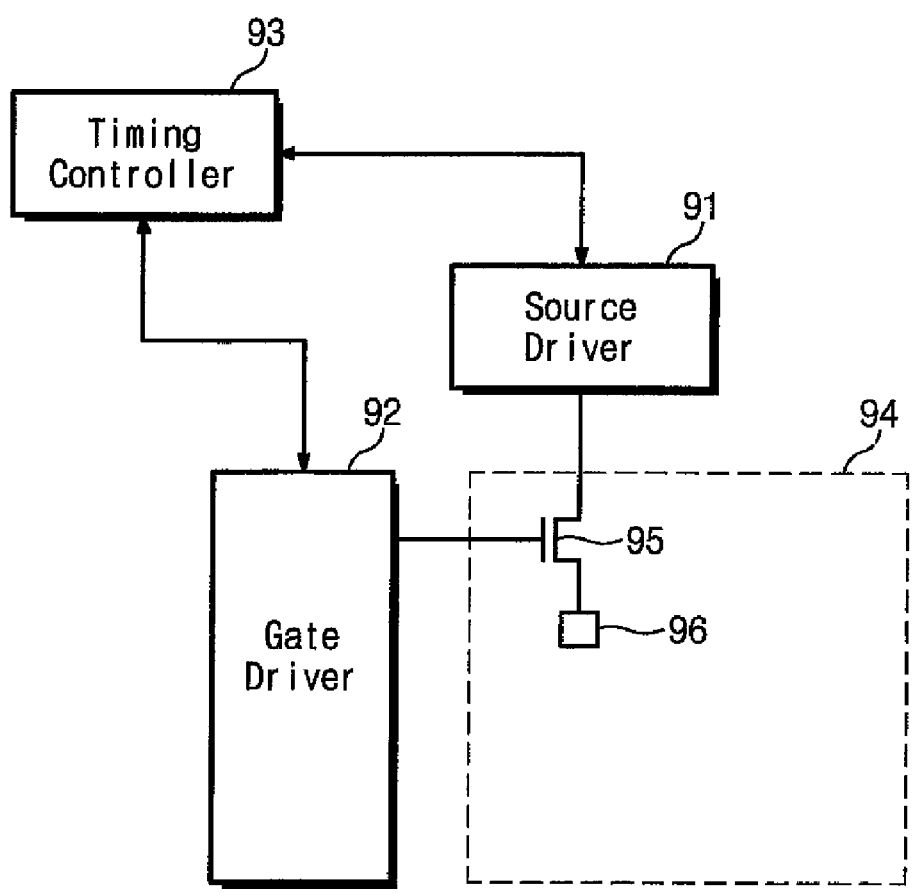
FIG. 9 is a block diagram illustrating the constitution of a liquid crystal display (LCD) using a DAC according to an embodiment of the present invention.

FIG. 9 is a block diagram illustrating the constitution of a liquid crystal display (LCD) system using a DAC according to an embodiment of the present invention. Referring to FIGS. 5 and 9, the DAC 100' of the present invention is used in a source driver 91 in the LCD panel 94. A timing controller 93 controls the source driver 91 and a gate driver 92.

The source driver 91 is connected to a source of an NMOS transistor 95. The gate driver 92 is connected to a gate of the NMOS transistor 95. A drain of the NMOS transistor 95 is connected to a pixel electrode 96. The LCD panel 94 is configured with a plurality of pixel electrodes.

The source driver 91 includes a plurality of the DACs 100' and at least one control logic 30.

The present invention provides a DAC by which circuit area can be reduced in comparison with conventional DACs that use a single decoder or a plurality of sub-decoders. In addition, there is provided a circuit for reducing an output error of a DAC by preventing the effect of parasitic capacitance at an input terminal of an OP-AMP caused by modulating a voltage level at a non-inverting input terminal of the OP-AMP when employing a sample and hold circuit realized by using the OP-AMP.

According to the present invention, a DAC can be realized within a minimum area. In addition, it is possible to prevent the effect of intrinsic parasitic capacitor in the DAC.

The above-disclosed subject matter is to be considered illustrative, and not restrictive, and the appended claims are intended to cover all such modifications, enhancements, and other embodiments, which fall within the true spirit and scope of the present invention. For instance, although the illustrated embodiments describe a DAC that is configured to receive 4-bit input data, the same bit-dividing approach and use of control logic could be applied to other input data formats. Moreover, the reference voltages used in describing the embodiments of the invention could be varied according to design choice. Thus, to the maximum extent allowed by law, the scope of the present invention is to be determined by the broadest permissible interpretation of the following claims and their equivalents, and shall not be restricted or limited by the foregoing detailed description.

What is claimed is:

1. A DAC (digital to analog converter) configured to convert digital data to an analog voltage, the digital data having upper bit data, control bit data, and lower bit data, the DAC comprising:

a control logic configured to receive the upper bit data and the control bit data and provide a control logic output;

a first resistor circuit configured to divide first and second reference voltages to output a plurality of first division voltages;

a first decoder coupled to the control logic and the first resistor circuit and, configured to provide a selected one of the plurality of first division voltages as a first decoder output in response to the control logic output;

a second resistor circuit configured to divide third and fourth reference voltages to output a plurality of second division voltages;

a second decoder receiving the lower bit data, coupled to the second resistor circuit, and configured to provide a selected one of the plurality of second division voltages as a second decoder output in response to the lower bit data;

a selection circuit receiving the control bit data, coupled to the second resistor circuit, and configured to provide a selected one of the third and fourth reference voltages as a selection circuit output voltage in response to the control bit data; and a sample and hold circuit coupled to the first and second decoders, and configured to output the analog voltage in response to the first decoder output, the second decoder output, and the selection circuit output voltage.

2. The DAC of claim 1, wherein the first resistor circuit includes a plurality of resistors coupled in series.

3. The DAC of claim 2, wherein each of the plurality of resistors have substantially the same resistance value.

4. The DAC of claim 1, wherein the second resistor circuit includes a plurality of resistors coupled in series, 5. The DAC of claim 4, wherein each of the plurality of resistors have substantially the same resistance value.

6. The DAC of claim 1, wherein the second and fourth reference voltages are common.

7. The DAC of claim 1, wherein the selected one of the plurality of first division voltages is one step greater than a voltage coded in the upper bit data when the control bit data is logic '1'.

8. The DAC of claim 1, wherein the selected one of the plurality of first division voltages is equal to a voltage coded in the upper bit data when the control bit data is logic '0'.

9. The DAC of claim 1, wherein the output voltage of the first decoder is increased by a voltage difference between the first division voltages when the control bit data is logic '1'.

10. The DAC of claim 1, wherein the sample and hold circuit is further configured to sample the first decoder output during a sample mode, receive the selected one of the third and fourth reference voltages from the selection circuit during a first hold mode, and adjust the selected one of the third and fourth reference voltages received during the first hold mode in response, at least in part to the second decoder output during a second hold mode.

11. The DAC of claim 10, wherein the sample and hold circuit includes:
an operational amplifier (OP-AMP) having an inverting input terminal, a non-inverting input terminal and an output terminal;
a first switch configured to electrically connect the inverting input terminal and the output terminal of the OP-AMP during the sample mode;
a capacitor coupled to the inverting input terminal of the OP-AMP;
a second switch configured to apply the first decoder output to the capacitor during the sample mode;
a third switch configured to electrically connect the second switch to the output terminal during the first and second hold modes; and
a fourth switch configured to electrically connect the selection circuit to the non-inverting input terminal of the OP-AMP during the first hold mode, and provide the second decoder output to the non-inverting input terminal of the OP-AMP during the second hold mode.

12. The DAC of claim 10, wherein the sample and hold circuit comprises:
an operational amplifier (OP-AMP) having an inverting input terminal, a non-inverting input terminal and an output terminal;
a first switch configured to electrically connect the inverting input terminal and the output terminal of the OP-Amp during the sample mode;
a first capacitor coupled to the inverting input terminal of the OP-AMP;
a second switch configured to electrically connect the first capacitor and the output voltage of the first decoder during the sample mode;
a third switch configured to electrically connect the second switch to the output terminal of the OP-AMP during the first and second hold modes;
a second capacitor connected to the non-inverting input terminal of the OP-AMP; and
a fourth switch coupled to the second capacitor and configured to connect the selection circuit to the second capacitor during the first hold mode, and transmit the second decoder to the second capacitor during the second hold mode.

13. The DAC of claim 12, further comprising a third capacitor coupled between the non-inverting terminal of the OP-AMP and ground.

14. A Liquid Crystal Display (LCD) system comprising:
a LCD panel; and
a source driver coupled to the LCD panel, the source driver including at least one digital to analog converter (DAC), wherein the at least one DAC is configured to divide input data into upper bit data, control bit data, and lower bit data,
wherein the DAC comprises:
control logic configured to receive the upper bit data and the control bit data and provide a control logic output;
a first resistor circuit configured to divide first and second reference voltages to output a plurality of first division voltages;
a first decoder coupled to the control logic and the first resistor circuit and, configured to provide a selected one of the plurality of first division voltages as a first decoder output in response to the control logic output;
a second resistor circuit configured to divide third and fourth reference voltages to output a plurality of second division voltages;
a second decoder receiving the lower bit data, coupled to the second resistor circuit, and configured to provide a selected one of the plurality of second division voltages as a second decoder output in response to the lower bit data;
a selection circuit receiving the control bit data, coupled to the second resistor circuit, and configured to provide a selected one of the third and fourth reference voltages as a selection circuit output voltage in response to the control bit data; and
a sample and hold circuit coupled to the first and second decoders, and configured to output the analog voltage in response to the first decoder output, the second decoder output, and the selection circuit output voltage.

15. The LCD system of claim 14, wherein the first decoder is a 4×1 decoder, and the second decoder is a 2×1 decoder.

16. The LCD system of claim 15, wherein the at least one DAC is a plurality of DACs, each of the plurality of DACs sharing a single control logic.

17. The LCD system of claim 14, wherein the LCD panel includes a NMOS transistor, a source of the NMOS transistor being coupled to the source driver.

18. The LCD system of claim 17, wherein the LCD panel further includes a pixel electrode coupled to a drain of the NMOS transistor.

19. The LCD system of claim 18 further comprising a gate driver coupled to the gate of the NMOS transistor.

20. The LCD system of claim 18 further comprising a timing controller coupled to the source driver and the gate driver.

* * * * *